United States Patent
Ashburn et al.

(10) Patent No.: US 9,378,848 B2
(45) Date of Patent: Jun. 28, 2016

(54) METHODS AND DEVICES FOR DETERMINING LOGICAL TO PHYSICAL MAPPING ON AN INTEGRATED CIRCUIT

(75) Inventors: Stanton Petree Ashburn, McKinney, TX (US); Daniel L. Corum, Richardson, TX (US); Abha Singh Kasper, Fairview, TX (US); Harold C. Waite, Rockwall, TX (US); Eric D. Rullan, Allen, TX (US); Donald L. Plumton, Dallas, TX (US); Douglas A. Prinslow, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1051 days.

(21) Appl. No.: 13/491,429

(22) Filed: Jun. 7, 2012

(65) Prior Publication Data

US 2013/0329508 A1    Dec. 12, 2013

(51) Int. Cl.
*G06F 11/00* (2006.01)
*G11C 29/56* (2006.01)
*G11C 29/18* (2006.01)

(52) U.S. Cl.
CPC .. *G11C 29/56008* (2013.01); *G11C 2029/1806* (2013.01); *G11C 2029/5604* (2013.01)

(58) Field of Classification Search
CPC .................................................. G11C 29/56008
USPC ..................................... 714/53, 723, 724, 730
See application file for complete search history.

(56) References Cited

U.S. PATENT DOCUMENTS

| | | | |
|---|---|---|---|
| 7,768,840 B1* | 8/2010 | Aleksanyan et al. | 365/189.02 |
| 8,447,884 B1* | 5/2013 | Baumann | 709/245 |
| 2003/0167426 A1* | 9/2003 | Slobodnik | 714/718 |
| 2009/0106716 A1* | 4/2009 | Aleksanyan et al. | 716/5 |
| 2014/0250341 A1* | 9/2014 | Mullarkey | 714/724 |
| 2014/0258804 A1* | 9/2014 | Pangal et al. | 714/752 |

* cited by examiner

*Primary Examiner* — Dieu-Minh Le
(74) *Attorney, Agent, or Firm* — Steven A. Shaw; Frank D. Cimino

(57) ABSTRACT

Methods and devices for mapping logical addresses to physical locations on an integrated circuit die are disclosed herein. An embodiment of the method includes fabricating a die, where the die has a plurality of bits that are electrically accessible by way of logical addresses. A plurality of bits have known defects that form a predetermined fault pattern at a predetermined location on the die. The bits are tested by using the logical addresses, wherein the testing yields data as to the functionality of the bits. The test results are searched for the predetermined fault pattern. The physical locations of the defective bits constituting the predetermined fault pattern are correlated with their logical addresses based on the location of the predetermined fault pattern.

13 Claims, 3 Drawing Sheets

METHODS AND DEVICES FOR DETERMINING LOGICAL TO PHYSICAL MAPPING ON AN INTEGRATED CIRCUIT

BACKGROUND

Dies used in integrated circuits, such as memory circuits, may have several billion components fabricated thereon. For example, a memory circuit that is capable of storing one gigabit of data needs to have one billion individual storage components, such as gates or other devices. In order to make the dies, masks or reticles are made that include all the components that are to be located on the dies. The reticles may also include information necessary to complete processes in the fabrication of the die, such as plating. Therefore, several reticles may be required in order to fabricate a single die.

With so many components fabricated on a die, the reticles have to be very dense and contain a tremendous amount of information. In order to achieve the density required to make memory circuits and other high density dies, specialized machines are used to make the reticles. The desired layout of a reticle is encoded in a computer program that is used by the machines to make the reticle. When a reticle is required to contain billions of components, the computer program used to generate the mask is extremely complex and may have errors. Accordingly, the reticle will likely have errors.

The complexity of the reticles causes other problems. For example, a die may have many thousands of memory instances. These instances have to be put in different orientations in order for them to fit onto the die. Butterflying and mirroring are used in placing these thousands of instances. Often, the documentation associated with the placement of the instances on the reticles is not properly updated, which leads to an unknown physical to logical mapping of the components.

After a reticle is made, a limited number of dies are fabricated using the reticle in order to test the reticle for errors. The dies fabricated using the reticles are then tested for errors. In the case of memory circuits, the dies may be powered up and have data written to and read from the memory addresses to determine if all the electronic components corresponding to the memory addresses are functioning correctly.

If a memory address is found to be faulty, the die must be analyzed to determine the cause of the fault in order to further determine if the reticle is faulty. However, with so many extremely small components located on a die, it is very time consuming to locate a faulty component. In many situations, physically locating the components corresponding to a faulty address may take hundreds of man hours, which significantly delays production of the integrated circuits. Accordingly, conventional methods of confirming the logical to physical mapping techniques, such as laser induced defects, are not feasible on these complex dies.

SUMMARY

Methods and devices for determining logical to physical mapping on a die are disclosed herein. An embodiment of a method commences with fabricating a reticle with a known fault pattern, wherein the fault pattern will cause certain components on the integrated circuit to be faulty. A die, such as a memory device, is fabricated using the reticle, wherein the die may have a plurality of bits made of components. The die is then tested, which tests the bits on the die. A faulty component will cause its corresponding bit to fail. Bit failures that are due to the faults induced by the reticle are mapped and appear in the shape of the fault pattern. The logical addresses of the faulty bits are determined based on the fault pattern. The addresses of the bits in the fault pattern serve as indexes to the locations of other bits and their respective components on the die. Accordingly, when the test data yields a defective logical address, its physical location can be determined based on the correlation between the logical addresses and physical locations of bits in the fault pattern.

DETAILED DESCRIPTION

Methods and devices for mapping the physical locations or coordinates of components on integrated circuits dies with their logical addresses are disclosed herein. The mapping of the locations of components on dies enables designers of the dies to physically locate the components. The designers can then analyze the components to determine the cause of problems or faults with the components. Masks or reticles and other devices used to make the die can then be analyzed to determine the cause of problems with components in the die. When applied to memory circuits, the devices and methods described herein enable designers to map specific logical addresses with specific physical locations of memory bits on a die. The locations of these specific memory bits serve as an orientation or indexing guide for locating other memory bits. Although the methods and devices described herein may relate to a plurality of different types of circuits, they are described in relation to memory circuits.

Figure 1:
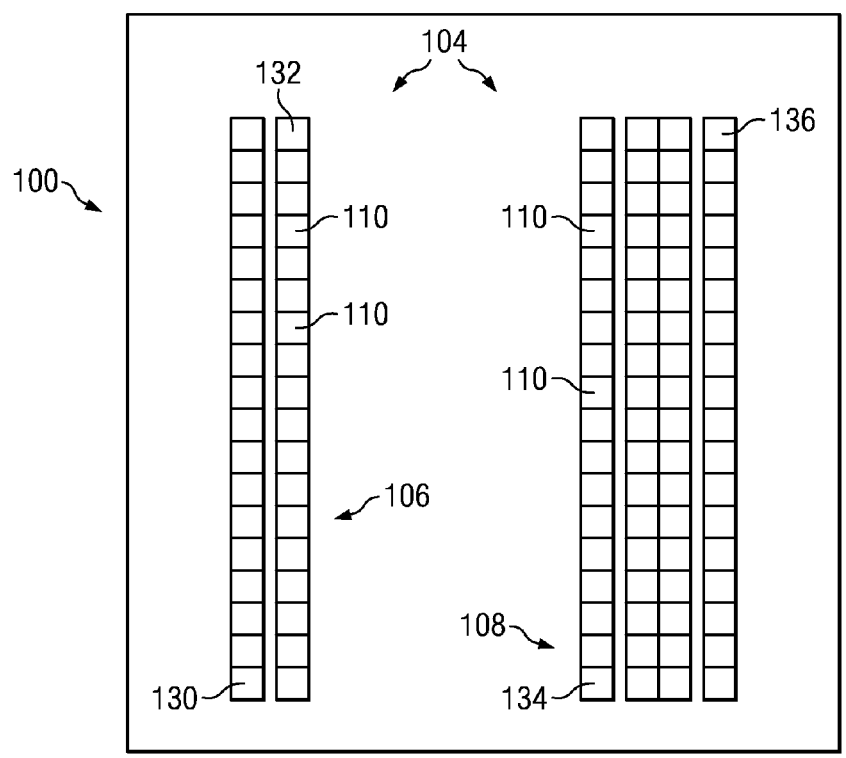
FIG. 1 is a plan view of an embodiment of a component layout of an integrated circuit die.

A diagram of a die 100 is shown in FIG. 1. The die 100 may include many thousands to billions of electronic components, however, for description purposes, only a few memory components are shown on the die 100. The memory components are organized into groups that are referred to as arrays or instances 104. The die 100 has two memory instances 104, which are referred to individually as a first memory instance 106 and a second memory instance 108. Each of the memory instances 104 has a plurality of memory segments 110 that are arranged in rows and columns. It is noted that the memory segments 110 may be in different configurations than those shown in FIG. 1.

Each memory instance 104 or segment 110 may have independent periphery circuitry (not shown), such as row decoders, and address circuitry that enables specific bits to be written to and read from. For example, specific memory addresses will read or write to specific memory bits as described in below. In the example of FIG. 1, both the first instance 106 and the second instance 108 have circuitry (not shown) that reads and writes to and from specific memory bits or locations on the segments 110.

Figure 2:
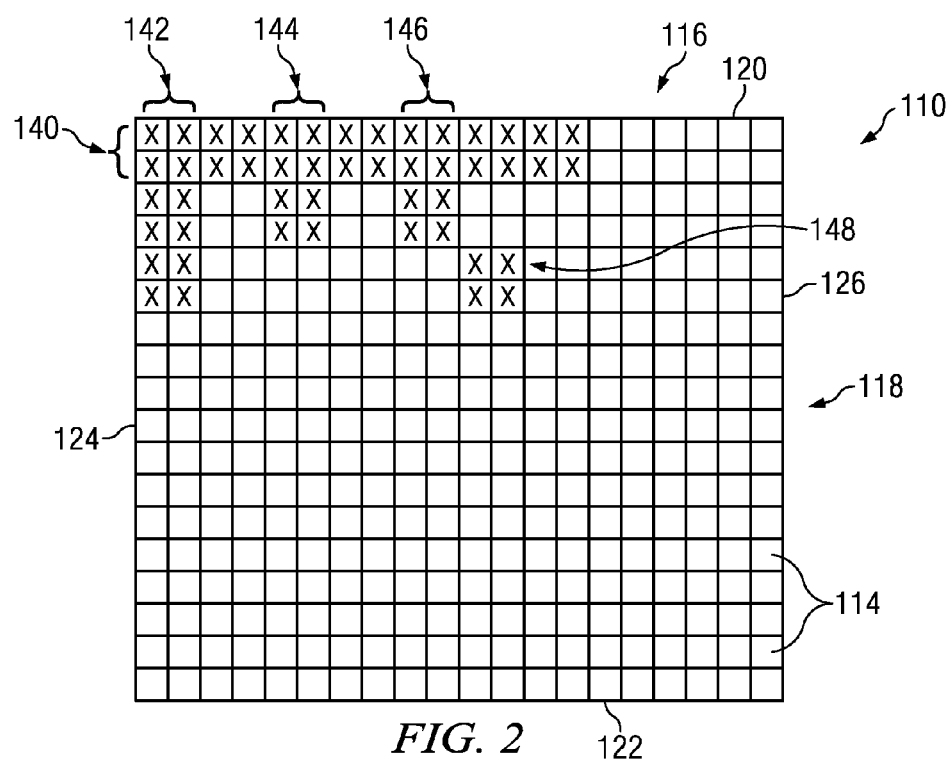
FIG. 2 is an example of the layout of a memory segment of a memory instance on the die of FIG. 1.

Additional reference is made to FIG. 2, which is a diagram of an exemplary memory segment 110. The memory segment 110 has a plurality of memory cells or bits 114 (sometimes referred to herein simply as "bits"). The memory segment 110 of FIG. 2 has a few hundred bits 114 for illustration purposes. However, in practice, the memory segment 110 may contain several thousand to several million bits 114. The bits 114 are arranged into a plurality of columns 116 and rows 118. Each bit 114 is an electronic component or a plurality of electronic components that store data in a conventional manner. Each bit 114 has a specific logical address associated therewith.

In the segment 110, each bit 114 stores either a logic high or a logic low voltage level. Each bit 114 is able to be electronically accessed by the above-described periphery circuitry. More specifically, each bit 114 is addressable by a specific logical address. Accordingly, each logical address corresponds to a specific bit 114, which is located in a specific column 116 and row 118. For reference purposes, the segment 110 has a top edge 120, a bottom edge 122, a left edge 124, and a right edge 126. The rows 118 extend parallel to the top edge 120 and the bottom edge 122. The columns 116 extend parallel to the left edge 124 and the right edge 126. However, the orientation of the columns 116 and rows 118 may change.

During fabrication of the die 100, billions of bits 114 and their supporting circuitry may be fabricated onto the die 100. The fabrication process is well-known in the art and involves creating a plurality of masks or reticles. Each reticle corresponds to a layer in the die 100 or is used to perform a process in fabricating layers in the die 100. For example, some reticles may be used to plate vias and other reticles may be used for etching.

Due to the enormous volume of data required to create a reticle, the reticles are created using computer programs. The computer programs that create a single reticle may have inputs from many sources, which can cause confusion with the layout of the die 100. One of the problems is that the exact locations of the bits 114 may not be know. For example, the designers know that a specific address accesses a specific bit, but they may not know where on the die 100 or where in the instances 104 the bit is physically located. Likewise, the designers may not know the physical locations of components that make up the specific bit. Another problem with locating specific bits is that the components that make up the bits 114 may only be a few nanometers wide, and with so many bits 114, it is very difficult to locate components corresponding to a single bit.

The above-described problems become very prevalent during the design and fabrication of dies. For example, the reticles may have some errors, which cause bits to be defective. These defects cause portions of the memory instances 104 to be defective. These defects include vias that may not be located correctly, or gates that may not be fabricated correctly. The defects will cause defective bits 114 in all dies made from the reticles. The defective bits need to be physically located on the die 100 so that they can be analyzed in order to determine the cause of their failure. The problem is that the designers may know the logical addresses of the defective bits, but due to the extreme complexity of the die 100, physically locating specific defective bits is extremely time consuming.

The devices and methods described herein reduce the time required to locate specific components on the die 100 by inducing faults in a preliminary reticle. The preliminary reticle causes bits located at known locations on the die 100 to be defective. By arranging the defective bits into predetermined fault patterns on the preliminary reticle, the designers can analyze a die fabricated using the preliminary reticle to locate the fault patterns. The fault patterns correspond to physical locations of bits constituting the patterns, which are mapped to their logical addresses. Thus, the fault patterns serve as orienteering or indexing points to locate other bits on the die 100. More specifically, the mapping of the logical addresses to the physical locations of bits 114 on the dies serves to guide designers to locate other bits outside of the fault pattern.

Figure 3:
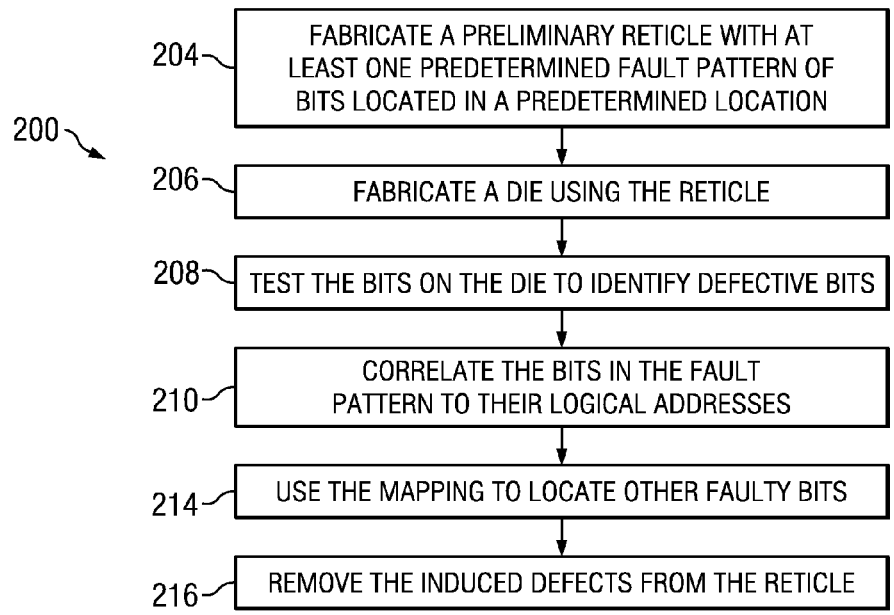
FIG. 3 is a flow chart describing an embodiment for determining logical to physical mapping of components on the die of FIG. 1.

A method of mapping the logical addresses to physical locations on the die 100 is described below and is also described in the flow chart 200 of FIG. 3.

The method commences with fabricating a preliminary reticle that forms at least one predetermined fault pattern positioned in a predetermined physical location on the die 100 as described at step 204 of the flow chart 200. The fault pattern consists of bits that are defective. It is noted that the reticle itself will not have defective bits, but rather will cause dies made using the reticle to have defective bits. After the reticle with the fault pattern has been made, the die 100 is fabricated using the reticle as described in step 206 of the flow chart 200. The die 100 has the defective bits arranged to form a predetermined fault pattern as described above. An example of a faulty bit pattern in a memory segment 110 made with the preliminary reticle is shown in FIG. 2, wherein the defective bits are marked with an "X". The pattern of defective bits shown in FIG. 2 is unique. Therefore, when the bits are tested, the unique pattern shown in FIG. 2 will be readily ascertained.

The fault pattern of faulty bits shown in FIG. 2 has one row 140 consisting of two rows 118 of bits 114 and three columns consisting of two columns 116 of bits 114 each. The rows and columns are sometimes referred to herein as lines, such as first lines and second lines. In the embodiment of FIG. 2, the row 140 is fourteen bits long. The columns are referred to individually as a first column 142, a second column 144, and a third column 146. The first column 142 extends four bits from the row 140. The second column 144 and the third column 146 both extend two bits from the row 140. The fault pattern also includes an index 148 that consists of two rows of bits by two columns of bits arranged as a square. It is noted that there are numerous other patterns that may be used herein. In addition, other angular orientations of the fault pattern of FIG. 2 may be used. For example the row 140 and columns 142, 144, 146 may be interchanged.

The pattern of FIG. 2 enables the circuit designers to readily identify the fault pattern and to identify the orientation of the pattern. For example the row 140 of FIG. 2 is located adjacent the top edge 120 of the segment 110. Likewise, the first column 142 is located adjacent the left side 124 of the segment 110. When the designer finds the pattern, he can index the row 140 and the first column 142 with the intersection of the top edge 120 and the left edge 122 of the segment 110. In some embodiments, the fault pattern may be placed a predetermined distance from the edges of the memory segment 110. The process of indexing the fault pattern to locations in the instances 104 will be described in greater detail below.

In the embodiment of FIG. 1, the known fault pattern is fabricated in four segments 110 in the first and second instances 106, 108. The fault pattern is located in a first segment 130 and a second segment 132 on the first instance 106. The fault pattern is also located in a third segment 134 and a fourth segment 136 on the second instance 108. As shown in FIG. 1, the fault patterns are located in segments at opposite sides of the instances 104. These locations provide for more accurate indexing of the fault patterns to individual bits as described below. Therefore, the locations of bits can be more easily ascertained.

After the die 100 is fabricated using the preliminary reticle, the die 100 is tested as described in step 208 of the flow chart 200. The testing involves testing the memory bits in the die 100. Several different embodiments for testing the memory locations or bits may be used. In summary, each bit should be able to have a logic high written to and read from it. Likewise, each bit should be able to have a logic low written to and read from it. In more specific testing, all the bits may be cleared to a logic low. All of the bits 114 may then be read. Any bits that are at a logic high state are determined to be defective. Likewise, all the bits 114 may also be set to a logic high and read. Any bits that are at a logic low state are determined to be defective. Other conventional testing of the bits 114 may also be implemented.

Figure 4:
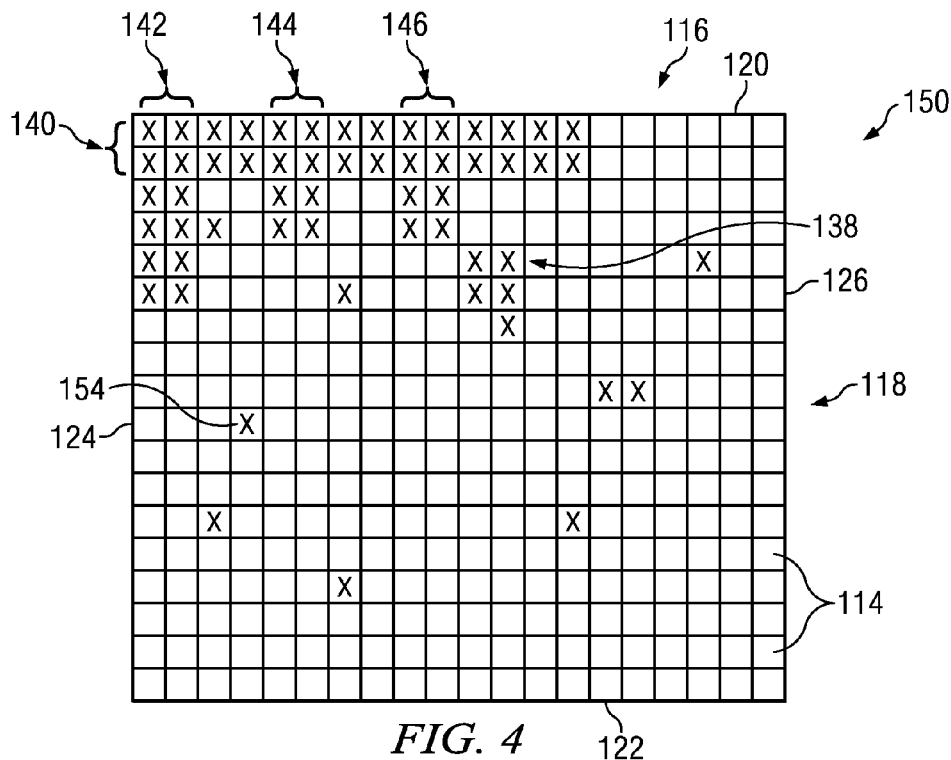
FIG. 4 is a logical mapping of the test data representative of bits of the memory segment of FIG. 2.

The resulting test data is mapped to locate bits that are defective on the die 100. The physical locations of the bits 114 are not known at this point, only the logical addresses of defective bits are known. The test data is analyzed to locate a pattern or sequences of defective bits that match the predetermined fault pattern. The logical addresses of the bits constituting the fault pattern are mapped to their physical locations in the fault pattern as described in step 212 of the flow chart 200. The rows and columns of the defective bits of the fault pattern are known because they were induced by the preliminary reticle on which the positions of the defective bits are known. An example of this mapping is shown in the diagram 150 of FIG. 4. The diagram 150 is a mapping of the bit test results based on the testing of the segment 110, FIG. 2. Bit locations marked with an 'X' are defective bits.

At this point in the process, analysis of the test data has yielded a mapping of the logical addresses of the bits constituting the fault pattern with their physical locations. The mapping can be used to locate other bits on the die 100 as described in step 214 of the flow chart 200. For example, the addresses of bits corresponding to the row 140 and the first column 142 of the fault pattern are known to correspond to the upper left edge of the segment 110. Using these correlations as index points, the physical locations of other bits are readily determined based on their logical addresses relative to the logical addresses of the bits in the fault pattern. In the diagram 150 of FIG. 4, there are several defective bits, however, a single defective bit 154, which is not in the fault pattern, will be analyzed. The test results indicate that the bit having a logical address of the bit 154 is determined to be defective, however, the physical location of the bit 154 is not known. It is known that the address of the bit 154 places it four rows down and two columns to the right of the end of the first column 142 of the fault pattern. Based on the indexing from the fault pattern, the physical location of the defective bit 154 on the die 100 is readily calculated. Designers of the die 100 may then analyze the location of the bit 154 on the die 100 and/or the reticle to determine why the bit 154 failed.

When the physical locations of the bits 114 can be mapped based on their logical addresses, designers can readily locate the bits 114 on the die 100. The designers can then determine the cause of the faulty bits. For example, the designers can determine if a wafer used to fabricate the die 100 is defective or if a problem exists in the reticle. Problems with the reticle can be fixed as described in step 216 of the flow chart 200. In addition, the preliminary reticle is modified to eliminate the code that induces the fault pattern. At this time, the reticle can be used to fabricate dies without the fault patterns.

Having described embodiments of the reticles and methods for correlating logical addresses with physical locations on integrated circuit dies, other reticles and methods will now be described.

The defects in the reticle may cause known types of faults in the die. For example, the reticle may induce faults in the various metal layers, dielectric layers, or vias. The different faults induced by the reticles will yield different failures in the bits. For example, some bits may have excessive gate leakage or they may not be able to be read from or written to. Inducing faults in the dielectric layers or metal layers of specific bits may cause other bits electrically connected to those specific bits to also fail. In addition, bits in close proximity to the metal or dielectric failures may also fail. The result is that a well-defined fault pattern as described above will not be readily achieved. This results in added time to correlate logical addresses to physical locations on the dies.

In some embodiments, the reticle makes vias in the bits of the fault pattern defective. For example, the vias electrically connecting specific layers in the bits of the fault pattern may be defective. These defects in the vias tend to cause faults that are easily detected because they are isolated to individual bits and may not affect the functionality of other bits. Therefore, a precise fault pattern on the die may be generated by the reticle.

The embodiments described above use a fault pattern that is substantially in the shape of an "F". The "F" shape provides good orientation when the data is analyzed. For example, when the "F" shape is located in the test data, the orientation of the die 100 is easily obtained because the "F" shape is not symmetric, therefore the shape is unique in all orientations. If the die 100 is rotated, the designers will not be confused as to the orientation of the "F" shape. Likewise, the "F" shape will appear reversed if it is inverted. This property of the "F" shape gives the designers additional tools when mapping the bits in that the precise orientation of the fault pattern is readily determined.

Figure 5:
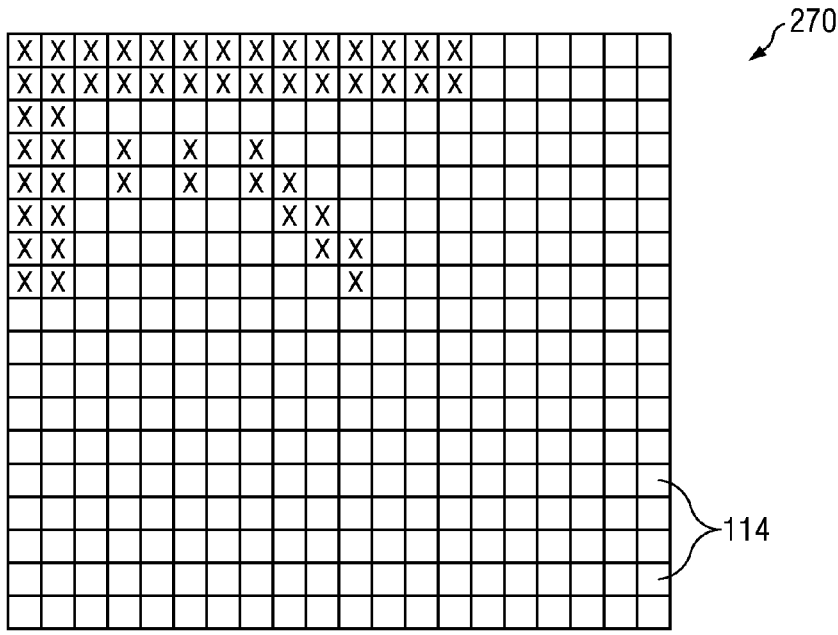
FIG. 5 is an embodiment of a fault pattern that may be used in a reticle.

Other fault patterns may be induced into the die 100 by the reticle. An example of an alternative fault pattern is shown by the fault pattern 270 of FIG. 5. The fault pattern of FIG. 5 is not symmetric, therefore, like the fault pattern of FIG. 2, the orientation of the fault pattern of FIG. 5 is easily determined. Ideally, the fault pattern will not be symmetric and it will have rows and columns that serve as indexes to locate other bits on the die 100.

Figure 6:
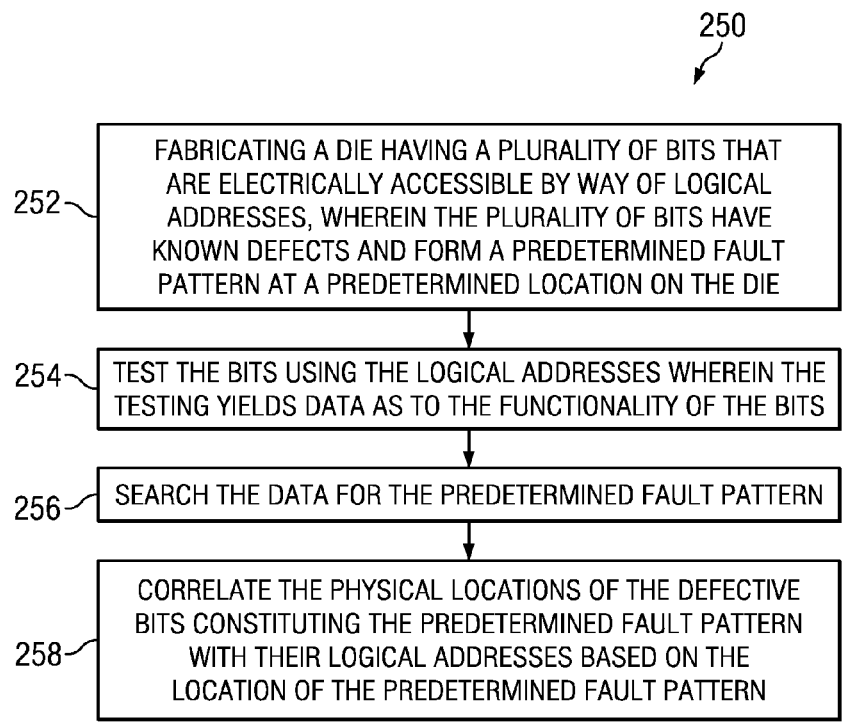
FIG. 6 is a flow chart in accordance with an embodiment.

The methods described above can be summarized below and by the flow chart 250 of FIG. 6. In step 252, a die having a plurality of bits that are electrically accessible by way of logical addresses is fabricated. The plurality of bits have known defects and form a predetermined fault pattern at a predetermined location on the die. In step 254, the bits are tested using the logical addresses, wherein the testing yields data as to the functionality of the bits. The data is then searched to locate the fault pattern at step 256 of the flow chart 250. The physical locations of the defective bits constituting the predetermined fault pattern are correlated with their logical addresses based on the location of the predetermined fault pattern at step 258.

What is claimed is:

1. A method for mapping logical addresses to physical locations on an integrated circuit die, the method comprising:
    fabricating a die, the die having a plurality of bits that are electrically accessible by way of logical addresses, wherein a plurality of bits have known defects, and wherein the plurality of bits form a predetermined fault pattern at a predetermined location on the die;
    testing the bits by using the logical addresses, wherein the testing yields data as to the functionality of the bits;
    searching the data for the predetermined fault pattern; and
    correlating the physical locations of the defective bits constituting the predetermined fault pattern with their logical addresses based on the location of the predetermined fault pattern.

2. The method of claim 1, wherein the die is a memory circuit.

3. The method of claim 1, wherein the die has a plurality of layers, wherein the layers are connected by way of vias within said layers, and wherein the defective bits are associated with the vias.

4. The method of claim 1, wherein the die has a plurality of layers, wherein the layers are connected by way of vias within said layers, and wherein the defective bits are caused by vias that do not conduct between the layers.

5. The method of claim 1, wherein the predetermined fault pattern has at least one first line and a plurality of second lines that are substantially perpendicular to the first line.

6. The method of claim 5, wherein a first one of the second lines has a length that is different than a second one of the second lines.

7. The method of claim 1, wherein the predetermined fault pattern includes at least one square.

8. The method of claim 1, wherein the predetermined fault pattern has at least one column intersected by a plurality of rows.

9. The method of claim 1, wherein the predetermined fault pattern has at least one row intersected by a plurality of columns.

10. The method of claim 1, wherein the defective bits are comprised of components, wherein at least one of the components has a known defect.

11. A method for making dies, the method comprising:
fabricating a reticle, wherein the reticle will induce defects in bits on a die made using the reticle, wherein the defective bits form a predetermined pattern;
fabricating a die using the reticle, wherein the die has the predetermined pattern of defective bits induced by the reticle, and wherein bits on the die are addressable using logical addresses;
testing the bits on the die by using the logical addresses, wherein the testing yields data as to the functionality of the bits;
searching the data for the predetermined pattern; and
correlating the physical locations of the defective bits with their logical addresses based on the location of the predetermined pattern.

12. The method of claim 11 and further comprising:
locating other defective bits on the die by way of the correlating; and
correcting the reticle to repair the other defective bits when the reticle is used to fabricate other dies.

13. The method of claim 11 and further comprising modifying the reticle so that it does not induce defects in bits on dies fabricated with the reticle.

\* \* \* \* \*